United States Patent [19]

Logan et al.

[11] 4,447,824
[45] May 8, 1984

[54] PLANAR MULTI-LEVEL METAL PROCESS WITH BUILT-IN ETCH STOP

[75] Inventors: Joseph S. Logan, Poughkeepsie, N.Y.; John L. Mauer, IV; Laura B. Rothman, both of Sherman, Conn.; Geraldine C. Schwartz, Poughkeepsie; Charles L. Standley, Wappingers Falls, both of N.Y.

[73] Assignee: International Business Machines Corporation, Armonk, N.Y.

[21] Appl. No.: 416,437

[22] Filed: Sep. 10, 1982

Related U.S. Application Data

[62] Division of Ser. No. 179,145, Aug. 18, 1980, Pat. No. 4,367,119.

[51] Int. Cl.³ .................. H01L 43/48; H01L 29/34; H01L 29/44; H01L 29/52

[52] U.S. Cl. ........................... 357/71; 357/54; 357/65

[58] Field of Search ............... 357/71, 54, 65

[56] References Cited

U.S. PATENT DOCUMENTS 3,985,597 10/1976 Zielinski .................. 427/91 X
4,184,909 1/1980 Chang et al. .............. 357/71 X Primary Examiner—Andrew J. James
Assistant Examiner—Seth M. Nehrbass
Attorney, Agent, or Firm—Henry Powers

[57] ABSTRACT

Use of a dual composite mask for a lift-off multi-layered structure process in which a base component layer acts as an etch stop for reactive ion etching of overlying layers.

5 Claims, 13 Drawing Figures

PLANAR MULTI-LEVEL METAL PROCESS WITH BUILT-IN ETCH STOP

This is a division of application Ser. No. 179,145 filed Aug. 18, 1980, now U.S. Pat. No. 4,367,119.

DESCRIPTION

1. Technical Field

This invention relates to a process for forming embedded metallurgy patterns on a substrate, and more particularly to the fabrication of semiconductor devices employing a process for forming an interconnection metallurgy system embedded in the passivating layer with a planar top surface.

One object of the present invention is to provide an improved method for forming passivated metal interconnection systems having surface planarity.

Another object of the present invention is to provide an improved lift-off method for forming metal interconnection systems for integrated circuits.

Another object of the present invention is to provide an improved process for forming multi-level and interconnected metallurgical conductor systems with reduced sensitivity to fabrication tolerances in forming semiconductor devices.

Another object of the present invention is to provide an improved method in the fabrication of semiconductor devices for forming multi-level metallurgical systems which reduces inter-level shorts due to over-etching in such operations.

2. Background Art

The forming of an interconnection metallurgy system for integrated circuit devices has conventionally been done by blanket depositing a metal layer, forming a photoresist layer on the metal layer, exposing the resist to the desired metallurgy pattern, developing the resist, and subsequently etching the exposed portions of the underlying metal layer to thereby form the interconnection metallurgy system. The pattern was subsequently covered by an insulating layer and another metallurgy pattern formed over same, making contact to the underlying layer through via holes, until the desired interconnection metallurgy system was complete. However, with continued miniaturization of semiconductor integrated circuits to achieve greater component density, particularly in large scale integrated circuitry, the metallurgy was made smaller and more dense. The planarity of the surface of the system became a serious consideration in the fabrication of interconnection systems. Each time a metallurgy pattern is deposited on a surface, the more irregular or non-planar the surface of the overlying insulating layer becomes. In general, after three levels of metallurgy have been deposited, the surface becomes so irregular that additional layers cannot be deposited properly. The irregular surface presents two very important problems which have a direct bearing on the yield and reliability of the resultant system. When a layer of metal is deposited over an irregular surface, the resultant layer becomes thinner over a step portion of the supporting layer. This thinned down portion results in current crowding and possible failure due to electromigration. A further problem is concerned with forming the resist pattern. Clear, distinct exposure and development becomes impossible as the surface becomes more irregular.

With subtractive etching of the blanket layer of metal, the sidewalls of the resultant stripe are sloping because the etchant works downwardly as well as inwardly. This reduces the cross-section of the resultant stripe, limiting its current carrying capacity. A technique which was developed to overcome this problem was termed "expendable mask method" or "lift-off method" which was initially described and claimed in U.S. Pat. No. 2,559,389. Improvements to the basic lift-off method have been made, as for example in commonly assigned U.S. Pat. No. 3,849,136 filed Aug. 31, 1973 and U.S. Pat. No. 3,873,361 filed Nov. 29, 1973. However, the lift-off technique for forming a metallurgy system does not overcome the non-planarity problem discussed previously.

A method of overcoming these shortcomings is disclosed in U.S. Pat. No. 3,985,597 filed May 1, 1975 which describes a process for forming an embedded interconnection metallurgy system on a substrate by forming a first layer of an organic thermosetting polymerized resin material on the substrate, forming a second overlying layer of a material that is soluble in a solvent that does not appreciably affect the material of the first layer, forming a third thin layer resistant to reactive ion etching in $O_2$ on the second layer, depositing a resist layer, exposing the resist to form an inverse pattern of the desired metallurgy pattern and developing the resist, removing the resultant exposed areas of the third layer, reactive ion etching the resultant exposed areas of the first and second layers, depositing a conductive metal layer having a thickness approximately matching the thickness of the first layer, and exposing the substrate to a solvent that is selective to the material of the second layer.

However, although an effective process is described therein, difficulties arise in its use with substantial increases in densities of semiconductor devices, particularly with increasing levels of metallization. Such higher densities of the devices render them sensitive to fabrication tolerance, particularly in the etching operations which can result in over etching with attendant problems of interlevel shorts in the metallization and interlevel defect densities. For example, four levels of metallization are becoming common in integrated circuit designs. With only three levels of metallization, integrated circuits become wire limited as the density of the device increases. A planar process is also necessary in order to maintain processing ground rules and insure good coverage of metal and insulators at all levels.

BRIEF DESCRIPTION OF THE DRAWINGS

In the accompanying drawings forming a material part of this disclosure.

DISCLOSURE OF THE INVENTION

The invention disclosed herein provides a technique for building a planar multi-level metal-insulator structure with the added advantage of an etch-stop. This is a significant advantage since it maintains the desired insulator thickness between levels of metallization. The tolerance on over-etching as second and higher level metallizations is reduced. Inter-level shorts and defects are also decreased due to the use of dual dielectrics.

Figure 8:
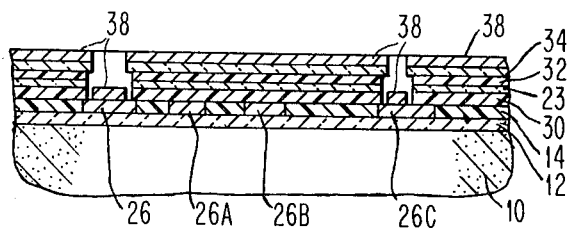

The process is illustrated in FIGS. 1 to 12. The first level metallization is defined using the polyimide planar process of the aforesaid U.S. Pat. No. 3,985,597. At the stud level (FIG. 6) the polyimide layer 30 is applied by spin coating and baked until fully cured. A plasma enhanced chemically vapor deposited (PECVD) layer 23 of silicon nitride, $Si_xN_yH_z$ (SiN) is formed (e.g. 500–2000 Å) as the etch stop layer. A polysulfone lift-off layer 32 (e.g. about 4000 Å) is applied by spin coating and is cured on a hotplate. A barrier layer 34 of $SiO_x$ (or glass resin) of about 2000 Å is then deposited by evaporation, spinning or PECVD, as appropriate. The via pattern 36 (FIG. 7) is defined (either by optical, E-beam, X-ray, or ion beam lithography) in the resist layer 35, and reactive ion etching is employed (a) in a $CF_4$ ambient to etch the $SiO_x$ layer 34; (b) in $O_2$ to etch the polysulfone layer 32; and (c) again in $CF_4$ to etch the silicon nitride layer 23; and finally in $O_2$ to etch the polyimide layer 30. An in-situ sputter cleaning step is preferably employed prior to evaporation of metal (aluminum/copper) studs 38A and 38B (FIG. 8) which are delineated from the metallization 38 (FIG. 8). Lift-off is done in n-methyl pyrrolidone (NMP) at 60° C. The process is then repeated.

Figure 13:
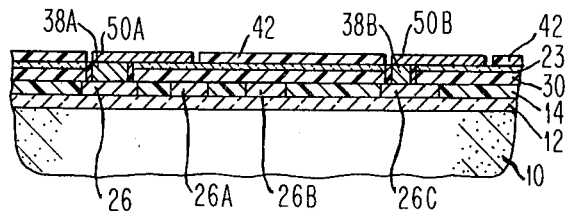

The silicon nitride etch stop layer is normally used only at the stud levels, however it can be used at all levels where necessary or desired. The silicon nitride provides a built-in etch stop for the reactive ion etch step shown in FIG. 11. By this technique there is no danger of over-etching, and thus the etching can be extended (e.g. to clear studs 38A and 38B), at second level metallization without concern over thinning of the insulator between metal levels. Also, in this manner, a dual dielectric of polyimide and silicon nitride is formed between the metallization levels (FIG. 13).

The steps of FIGS. 6 to 13 can be repeated for as many levels of metallization as required or necessary (e.g. 2nd stud/3rd metallization, 3rd stud/4th metallization, etc).

Although the use of a silicon nitride etch-stop layer and a $SiO_x$ layer for masking has been explicitly noted, one could use the silicon nitride or the silicon oxide for both layers as well as other suitable inorganic dielectrics, such as $TiO_2$, $Ta_2O_5$ etc., which are etchable in $CF_4$ plasma and resistant to $O_2$ plasma. However, there are advantages to using the $SiO_x$ as the masking barrier layer (e.g. 34, FIG. 5 etc). Resist adhesion to $SiO_x$ is excellent whereas silicon nitride does not provide a good surface for resist adhesion. Also, the silicon nitride etches more than five times as fast in $CF_4$, as does the $SiO_x$, and therefore a thinner layer of $SiO_x$ can be used, which in turn means that the resist used for pattern definition can also be thinner which is important for lithographic registration.

In summary, a process has been described for fabrication of a planar multi-level metal-insulator structure with a built-in etch stop layer. The process also includes a dual dielectric between all metal levels, thereby decreasing interlevel shorts. Also, the process is compatible with conventional semiconductor fabrication techniques, and due to the etch stop layer, the sensitivity to process tolerances in reduced.

BEST MODE FOR CARRYING OUT THE INVENTION

Figure 1:
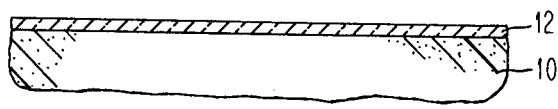
FIGS. 1 to 13 show a sequence of elevational views, in broken section, illustrating a substrate at various stages of fabrication utilizing the concept of the invention described herein.

Referring now to the drawings and in FIG. 1 in particular, there is disclosed a substrate 10 which is typically monocrystalline silicon or other semiconductor material with an overlying layer 12 of a dielectric layer, as for example $SiO_2$. The substrate 10 in the preferred embodiment of the process of the invention is an integrated circuit device having active and passive devices fabricated therein (not shown) and means for electrically isolating the devices from each other. In this application, layer 12 is provided with contact openings (not shown) for making contact to the active and passive devices. The substrate could also be a body of insulating material when the process is used to form metallurgy on a module for supporting integrated circuit devices and appropriate associated circuitry.

Figure 2:
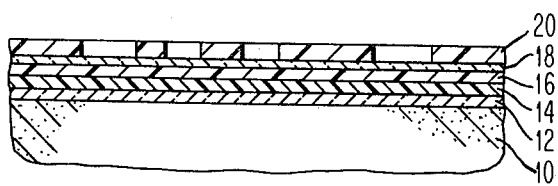

As illustrated in FIG. 2, a first layer 14 of an organic thermosetting polymerized resin material is formed on substrate 10. The material of layer 14 can be of any suitable material that will adhere to layer 12. If necessary or desirable, the surface of layer 12 can be treated to insure adhesion of layer 14. A preferred material for layer 14 is a polyimide plastic material. An example of such a material is commercially available sold under the trademark of Skybond 703 from Monsanto of St. Louis, Mo.

The polyimide is formed by reacting pyromellitic dianhydride with an aromatic diamine which yields a polyamic acid. The polyamic acid is dehydrated in-situ. A preferred technique for forming layer 14 is by depositing the material in liquid form on a substrate and then spinning. The spinning action flows the material over the surface of the wafer to a relatively uniform thickness. The material is subsequently heated to dehydrate or cure the material. With the preferred polyimide material, the curing can be accomplished by heating 20 minutes at 80° C. which removes the solvent from the material. A second heating for ten minutes at 200° C. causes imidization. A third heating step for 20 minutes at 300° C. causes the material to cross-link. Other suitable materials can be utilized. In general, the material to be used should have a high temperature stability of over 400° C. and have a suitable viscosity such that it will flow during the deposition and to a small extent during the curing cycle. The thickness of layer 14 is controlled by the viscosity of the material deposited on the wafer and the rate at which it is spun during the deposition. Typically, the thickness is in the range of one to five microns, more preferably fron 1 to 2 microns when used in integrated circuit interconnection metallurgy applications.

A second layer 16, also preferably of an organic polymerized resin material, such as polysulfones, polycarbonates, etc., is deposited on layer 14 as shown in FIG. 2. The material of layer 16 is chosen such that it is soluble in a solvent that does not appreciably affect the material of layer 14. A preferred material for layer 16 is a polysulfone polymerized resin formed by reacting sulphur dioxide with aromatic or aliphatic vinyl compounds. A typical polysulfone resin is sold under the trademark ICI 100-P by Imperial Chemical Inc. The polysulfone resin is available as a relatively viscous liquid which can be deposited on a wafer and then spun in the range of 4000 rpm. Preferably, the polysulfone material, whih is in a solution of n-methyl pyrrolidone, is deposited and spun at a low humidity or an $N_2$ atmosphere. The material is subsequently cured by heating for five minutes at 80° C. and for 20 minutes at 300° C. The thickness of layer 16 is typically in the range of 0.3 to 2.5 microns, more preferably in the range of 0.3 to 1.0 microns in integrated circuit applications. A relatively thin masking layer 18 is subsequently deposited in layer 16.

Layer 18 can be of any suitable material that is resistant to reactive ion etching in $O_2$ as will become more apparent in the description that follows. Layer 18 can be a layer of $SiO_2$, $SiO_x$, $Al_2O_3$, Si, $Si_xN_yH_z$, glass resin or a metal layer. A preferred material for layer 18 is $SiO_x$ deposited by evaporation or by plasma enhanced CVD. However, any suitable type of glass or inorganic material that is resistant to reactive ion etching, particularly in an $O_2$ ambient or an ambient that contains $O_2$ can be used. A layer 20 of a photoresist is then deposited on the surface of layer 18, exposed to form the inverse of the desired metallurgy pattern, and developed as shown in FIG. 2. The resist material of layer 20, its exposure and development is in accordance with known technology.

Figure 3:
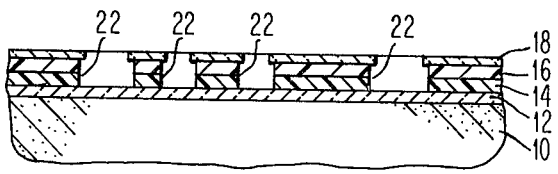

As shown in FIG. 3, the exposed portions of layers 14, 16 and 18 are then removed forming vertical walls with layers 14 and 16 undercut from layer 18. The exposed portions of layer 18 can be removed by any suitable technique, as for example dip etching or the like in a suitable solvent. A preferred technique for removing the material of the three layers is by reactive ion etching. In reactive ion etching, the substrate is exposed to a reactive ion plasma generated in an appropriate ambient by an RF power source. Preferred apparatus for performing the operation is illustrated and claimed in U.S. Pat No. 3,598,710. In removing the material of layer 18 when the material is a $SiO_x$, the ambient at least includes $CF_4$. More preferably, the removal of the exposed portions of layer 18 is achieved by an ambient consisting of $CF_4$, at a pressure of 50 millitorr and a power density of 0.15 watts/cm$^2$. The layer 18 is etched away in a few minutes. Subsequently, the ambient in the sputter apparatus is changed to an $O_2$ ambient and the exposed portions of layers 14 and 16 are removed as shown in FIG. 3. Preferably, the etching is accomplished at a pressure of 100 millitorr of $O_2$ at a power density of 0.25 watts/cm$^2$. Alternately, the ambient could consist of $O_2$ in combination with argon or nitrogen. As indicated in FIG. 3, the sidewalls of the openings 22 are substantially vertical and undercut.

Figure 4:
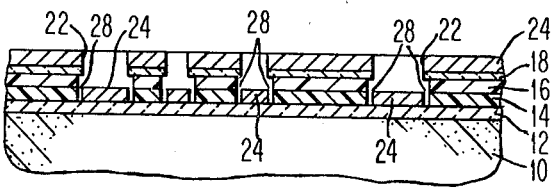

As shown in FIG. 4, a metallic layer 24 is deposited by evaporation on the resultant surface of the substrate 10 resulting in a layer on the top surface of layer 18 and also portions in openings 22 resting on layer 12. The thickness of layer 24 should be approximately the same thickness of layer 14. Layer 24 of conductive material can be of any suitable type of material such as aluminum, aluminum/copper alloys, molybdenum, tantalum, or laminated combinations such as chromium-silver-chromium, molybdenum-gold-molybdenum, chromium-copper-chromium, and the like.

Figure 5:
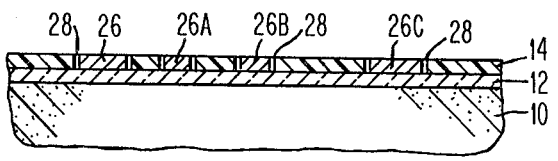

As shown in FIG. 5, layer 16 and all of the overlying layers are then removed by exposing the substrate to a solvent for the material of layer 16. When the preferred material of layer 16 is used, i.e. polysulfone plastic, as described previously, the solvent is n-methyl pyrrolidone at 60° C. The bath is preferably agitated by an ultrasonic device to hasten removal of the layers. Any suitable solvent can be used subject to the condition that it is selective to the material of layer 16 and does not appreciably affect the material selected for layer 14. The resultant structure is illustrated in FIG. 5 wherein remaining metallurgy patterns 26, 26A, 26B, and 26C are surrounded by layer 14 and wherein the surface presented by the pattern and layer is substantially coplanar. Note that small spaces 28 exist between the pattern 26 and layer 14. These, however, are filled in when the second sequence of steps is used to form the next layer and metallurgy pattern.

Figure 6:
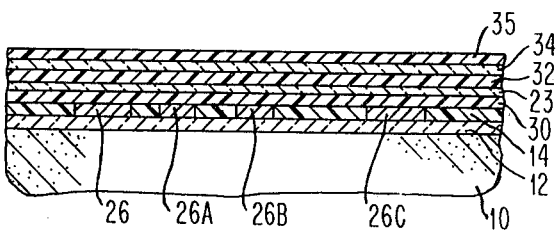
Figure 7:
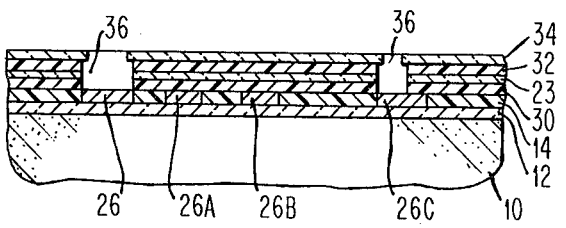

As shown in FIG. 6, the structure shown in FIG. 5 is covered with an organic thermosetting polymerized resin layer 30 similar to the material of layer 14 and formed thereon in the same manner previously described. As shown in FIG. 6, and in accordance with this invention, layer 30 is covered with a thin layer 23 (e.g. about 500 to 2000 Å) of silicon nitride by any conventional low temperature process, as for example plasma enhanced chemical vapor deposition.

In the PECVD process, typically substrates are placed on a heated table (typically at 270° C.) in a conventional vacuum process chamber. The chamber is equipped with a planar cathode which is electrically connected to a source of RF power. Gases are admitted to the chamber which can react to form the desired film. For example, the following conditions are found to produce a usable SiN film:

144 sccm* $SiH_4$;
650 sccm $N_2$;
480 sccm $NH_3$;
300 mtorr Total Pressure;
500 watts RF Power 50 KHz.

*Standard Cubic Centimeters Per Minute

Layer 32 corresponds to layer 16 and layer 34 to layer 18. A photoresist layer 35 is then applied on layer 34, and patterned by suitable exposure to form a via pattern 36. The pattern 36 shown formed in layers 34, 32, 23 and 30 is typically the via hole pattern for forming the connection between the lower metallurgy pattern 26 and the pattern to be formed. When layer 30 is deposited, the openings 28 are filled in by the material as it is spun on the surface. As above, the $SiO_x$ layer 34 is reactive ion etched (RIE) in an ambient of $CF_4$, which is switched to an $O_2$ ambient for RIE etching of the polysulfone layer 32. A $CF_4$ ambient is again utilized for RIE etching of the silicon nitride layer 23, with a return to $O_2$ ambient for RIE etching of the polyimide layer 30. The substrate can then be subjected to a chemical clean up in 7:1 buffered HF for ten seconds.

In FIG. 8, there is illustrated the structure after the second sequence of method steps, i.e. as illustrated in FIGS. 1-5, which are used to form the via openings in layer 30 and the via metallurgy pattern or studs 38A and 38B.

Figure 9:
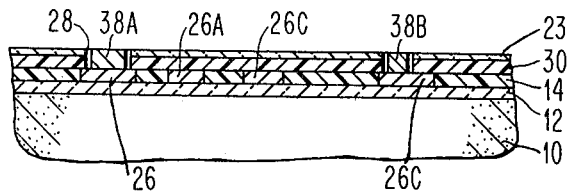
Figure 10:
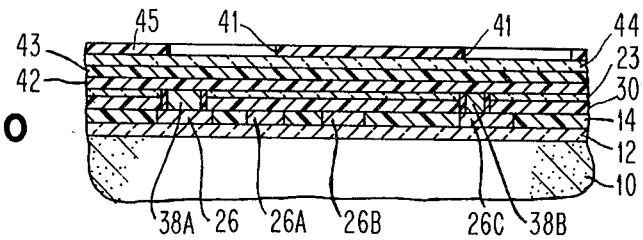

The via studs 38A and 38B are formed by a blanket deposition of a suitable conductor layer 38 (e.g. AlCu), followed by a lift-off of excess layers in a suitable solvent (e.g. n-methyl pyrrolidone) for the solvent soluble layer 32 (e.g. polysulfone). The resultant structure is shown in FIG. 9 where it will be noted that the silicon nitride layer portion 23 is retained on the substrate. Also, the lower level metallization segments 26A and 26B remain embedded in the dual insulator layers 23 and 30 since no interconnection is designed between them and upper level metallization patterns.

The proceeding processing steps can be repeated to sequentially deposit the insulator layer 42 (e.g. polyimide), the solvent soluble lift-off layer 43 (e.g. polysulfone) and the barrier mask layer 44 (e.g. $SiO_x$), with an overlying resist layer 45 which is suitably patterned with openings 41, by conventional optical, E-beam, X-ray or ion beam lithographic techniques, to define the second level metallization pattern.

Figure 11:
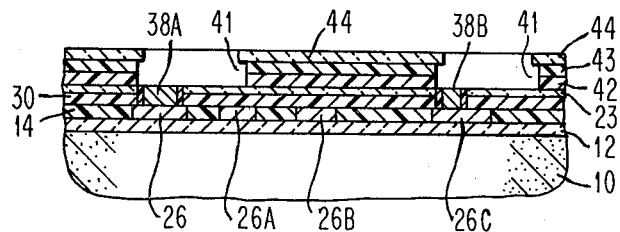
Figure 12:
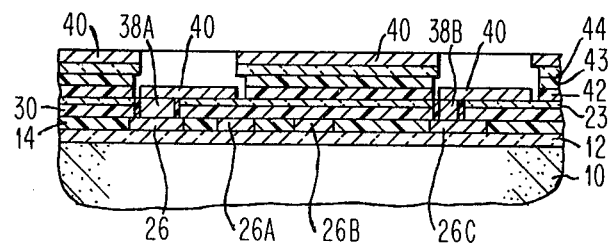

FIG. 11 shows the resultant structure obtained by RIE etching of the various layers, specifically RIE etch the mask layer 44 (e.g. $SiO_x$) in a $CF_4$ ambient, and the sequential RIE etching of the solvent soluble layer 43 (e.g. polysulfone) and the insulator layer 42 (e.g. polyimide) in a $O_2$ ambient. As shown in FIG. 11, the RIE etching is stopped at the etch-stop layer 23 (e.g. silicon nitride) which prevents any erosion or thinning of the underlying polyimide insulator layer 30. The silicon nitride serves as an etch-stop during RIE as the metal levels for interconnection of multi-level metallization or conductor patterns. This eases processing tolerances for the etching operations, permitting sufficient time to insure complete etch through to pattern segments 38A and 38B without danger of thinning the inter-level insulating layer 30 which could result in inter-level shorts. After formation of the second level metallization pattern openings 41, a conductive (e.g. AlCu) layer 40 is blanket deposited (e.g. evaporation) on the structure, inclusive of openings 41, followed by lift-off of the surplus elements by solvation of the solvent soluble layer 43 (polysulfone) which also carries away the overlying layers 44 and 40. This results in the retention and formation of the second level metallization pattern 50A/50B (FIG. 13) unitized or interconnected through respective studs 38A and 38B to the first level metallization pattern 26/26C. As will be noted in FIG. 13, it illustrates a structure having the second level metallization segment 50 overlying the first level metallization segment 26A without danger of inter-level shorts due to the use of the etch-stop layer 23 which prevents thinning or etching of the insulator layer 30 (polyimide). An additional advantage is obtained since the insulator layer 30 (polyimide) and the etch-stop layer 23 (silicon nitride) form a dual dielectric between metal levels which reduces the interlevel defect density.

As will be apparent to those skilled in the art, any desired number of interconnection layers can be formed by repeating the steps of FIGS. 6 to 13.

While the invention has been illustrated and described with reference to preferred embodiments of the invention, it is to be understood that the invention is not to be limited to the precise construction herein disclosed and the right is reserved to all changes and modifications coming within the scope of the invention as defined in the appended claims.

Having thus described the invention, what is claimed as new, and desired to be secured by Letters Patent is:

1. In an integrated circuit package, a substrate having a conductive interconnected pattern on a surface thereof, a superposed conductive structure comprising:
   (A) a composite layered structure on said substrate comprising
      (a) a lower layer of an electrically insulating organic polymer overlying said surface and said pattern and
      (b) a covering oxygen plasma resistant inorganic insulating layer overlying said polymer layer,
   (B) at least one via opening through said composite layered structure to a portion of said pattern,
   (C) a second conductive pattern on said inorganic insulating layer, and
   (D) conductive means in said via opening interconnecting the first said pattern and said second pattern.

2. The structure of claim 1 wherein said inorganic insulating layer is silicon nitride.

3. The structure of claim 1 wherein said polymer is a polyimide.

4. The integrated circuit package of claim 1 wherein said substrate is a silicon semiconductor device.

5. The integrated circuit package of claim 1 wherein said substrate is selected from ceramic and glass-ceramic substrates.

* * * * *